United States Patent
Luebs et al.

(10) Patent No.: US 6,477,058 B1
(45) Date of Patent: Nov. 5, 2002

(54) INTEGRATED CIRCUIT DEVICE PACKAGE INCLUDING MULTIPLE STACKED COMPONENTS

(75) Inventors: Richard J Luebs, Windsor, CO (US); Jonathan W Craig, Fort Collins, CO (US); Jeffrey L. Deeney, Fort Collins, CO (US); David W. Peters, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/894,923

(22) Filed: Jun. 28, 2001

(51) Int. Cl.[7] .............................. H05K 1/11; H05K 1/14
(52) U.S. Cl. ...................... 361/784; 361/792; 361/790; 361/764; 361/777; 174/250; 174/255; 439/66
(58) Field of Search ................................. 361/784, 764, 361/687, 704, 719, 760, 790, 795, 804, 718, 732, 748, 792, 801, 777; 174/52.1, 250, 255; 439/66, 525, 526

(56) References Cited

U.S. PATENT DOCUMENTS

| | | | |
|---|---|---|---|
| 5,215,472 A | * | 6/1993 | DelPrete et al. ............ 439/331 |
| 5,329,426 A | * | 7/1994 | Villani .......................... 24/625 |
| 5,883,788 A | | 3/1999 | Ondricek et al. ............ 361/768 |
| 6,061,235 A | | 5/2000 | Cromwell et al. ........... 361/690 |
| 6,074,219 A | * | 6/2000 | Tustaniwskyj et al. ....... 439/66 |
| 6,084,178 A | | 7/2000 | Cromwell ..................... 174/35 |
| 6,094,344 A | * | 7/2000 | Nakagawa et al. .......... 361/687 |
| 6,198,630 B1 | | 3/2001 | Cromwell .................... 361/704 |
| 6,219,239 B1 | | 4/2001 | Mellberg et al. ............. 361/704 |
| 6,287,892 B1 | * | 9/2001 | Takahashi et al. ........... 438/107 |

* cited by examiner

*Primary Examiner*—David Martin
*Assistant Examiner*—Hung Bui

(57) ABSTRACT

An integrated circuit device package in accordance with the invention comprises a first land grid array (LGA) interposer socket positioned between, and in communication with, an LGA integrated circuit device and a first side of a first circuit board; a second LGA interposer socket positioned between, and in communication with, a second circuit board and a second side of the first circuit board, wherein the second side of the first circuit board is opposite to and parallel with the first side of the first circuit board; and a clamping mechanism for compressively urging together the LGA integrated circuit device, the first LGA interposer socket, the first circuit board, the second LGA interposer socket, and the second circuit board into electrical interconnection under a predetermined load.

20 Claims, 4 Drawing Sheets

INTEGRATED CIRCUIT DEVICE PACKAGE INCLUDING MULTIPLE STACKED COMPONENTS

BACKGROUND OF THE INVENTION

1. Field of the Invention

The present invention relates generally to integrated circuit device packaging. More particularly, the present invention relates to integrated circuit device packages comprising multiple, stacked components that are electrically interconnected using land grid array connection techniques.

2. Description of the Related Art

To provide a higher level of functionality to an integrated circuit (IC) device, the device can be mounted on a circuit board, for example, a daughter card, carrying function enhancing electrical elements. The daughter card is in turn electrically connected to a larger circuit board, usually the mother board of a computer.

The terminations on the IC device are typically soldered to pads on the daughter card. However, high pin count devices, such as very large scale integrated (VLSI) ICs, that are soldered in place are difficult to rework in the event of a faulty connection nor can they be easily removed and replaced if found to be defective, or in need of upgrading. If there are other expensive components on the daughter card, the scrap cost can be significant if the rework or removal operation fails. In addition, soldered joints are often unreliable under temperature cycling and perform poorly under the compressive loads imposed by heat sinks required to dissipate heat from high power IC devices.

Another approach to connecting an IC device to a daughter card is to use mating pins and pin sockets, such as pin grid arrays. However, such connectors add cost to the components and often cause signal degradation because of increased inductance.

The connection of the daughter card to the mother board has also involved the use of hard wiring, mateable pins and pin sockets, as well as other interconnections such as edge connectors. Here again, high pin or lead counts make such connections undesirable for the reasons already stated: high cost, signal degradation and, where soldered joints are utilized, the difficulty of repair or replacement.

In one known area array IC device packaging and interconnection technique, called land grid array (LGA), electrical connection is established through pad-to-pad contact by clamping the IC device to a higher assembly through an intervening LGA interposer socket having compliant, coplanarity-maintaining contacts. LGA technology provides high density, small footprint, low profile IC device interconnections with low inductance for high speed applications. Moreover, LGA devices avoid thermal mismatch problems, cost less to manufacture and to assemble and can be easily removed and replaced.

U.S. Pat. No. 5,883,788 to Ondricek, et al., for BACKING PLATE FOR LGA MOUNTING OF INTEGRATED CIRCUITS FACILITATES PROBING OF THE IC'S PINS; U.S. Pat. No. 6,061,235 to Cromwell, et al., for METHOD AND APPARATUS FOR A MODULAR INTEGRATED APPARATUS FOR HEAT DISSIPATION, PROCESSOR INTEGRATION, ELECTRICAL INTERFACE, AND ELECTROMAGNETIC INTERFERENCE MANAGEMENT; U.S. Pat. No. 6,084,178 to Cromwell for PERIMETER CLAMP FOR MOUNTING AND ALIGNING A SEMICONDUCTOR COMPONENT AS PART OF A FIELD REPLACEMENT UNIT (FRU); U.S. Pat. No. 6,198,630 to Cromwell for METHOD AND APPARATUS FOR ELECTRICAL AND MECHANICAL ATTACHMENT, AND ELECTROMAGNETIC INTERFERENCE AND THERMAL MANAGEMENT OF HIGH SPEED, HIGH DENSITY VLSI MODULES; and U.S. Pat. No. 6,219,239 to Mellberg, et al., for EMI REDUCTION DEVICE AND ASSEMBLY, all of which are commonly assigned to the assignee of the present invention, disclose examples of LGA IC device packaging. These patents are incorporated herein by reference for their teachings of LGA interconnection and clamping techniques, and integrated thermal management.

SUMMARY OF THE INVENTION

In accordance with one specific, exemplary embodiment of the invention, there is provided an integrated circuit device package comprising a first land grid array (LGA) interposer socket positioned between, and in communication with, an LGA integrated circuit device and a first side of a first circuit board; a second LGA interposer socket positioned between, and in communication with, a second circuit board and a second side of the first circuit board, wherein the second side of the first circuit board is opposite to and parallel with the first side of the first circuit board; and a clamping mechanism for compressively urging together the LGA integrated circuit device, the first LGA interposer socket, the first circuit board, the second LGA interposer socket, and the second circuit board into electrical interconnection under a predetermined load.

In accordance with another specific, exemplary embodiment of the invention, there is provided an integrated circuit device package comprising a land grid array integrated circuit device; a first circuit board having opposed, parallel, first and second major surfaces, each of the major surfaces of the first circuit board including a land grid array; a second circuit board having opposed, parallel, first and second major surfaces, the first major surface of the second circuit board including a land grid array; a first land grid array interposer socket sandwiched between the land grid array integrated circuit device and the land grid array on the first major surface of the first circuit board; a second land grid array interposer socket sandwiched between the land grid array on the second major surface of the first circuit board and the land grid array on the first major surface of the second circuit board; and a clamping mechanism for compressively urging into electrical interconnection (i) the land grid array integrated circuit device and the land grid array on the first major surface of the first circuit board through the first land grid array interposer socket, and (ii) the land grid array on the second major surface of the first circuit board and the land grid array on the first major surface of the second circuit board through the second land grid array interposer socket.

In accordance with yet another specific, exemplary embodiment of the invention, there is provided an apparatus for electrically interconnecting a plurality of stacked electrical components including a land grid array integrated circuit device, a daughter card and a mother board, the daughter card having opposed, parallel, first and second major surfaces, the mother board having opposed, parallel, first and second major surfaces, the apparatus comprising a land grid array on each of the first and second major surfaces of the daughter board electrically connected to electrical elements carried by the daughter board; a land grid array on the; first major surface of the mother board electrically connected to electrical elements carried by the mother board; a first land grid array interposer socket and a second land grid array interposer socket, the first interposer socket enabling electrical connection between the land grid array integrated circuit device and the land grid array on the first major surface of the daughter card, and the second land grid array interposer socket enabling electrical connection between the land grid array on the second major surface of the daughter card and the land grid array on the mother board; a clamping plate for overlying the integrated circuit device; and a clamping mechanism for compressively urging the integrated circuit device, the first interposer socket, the daughter card, the second interposer socket and the mother board into electrical interconnection under a predetermined load.

BRIEF DESCRIPTION OF THE DRAWINGS

The foregoing and other objects, features and advantages of the invention will be apparent to those skilled in the art from the detailed description, below, taken together with the accompanying drawings, in which.

DETAILED DESCRIPTION OF THE PREFERRED EMBODIMENTS

Figure 1:
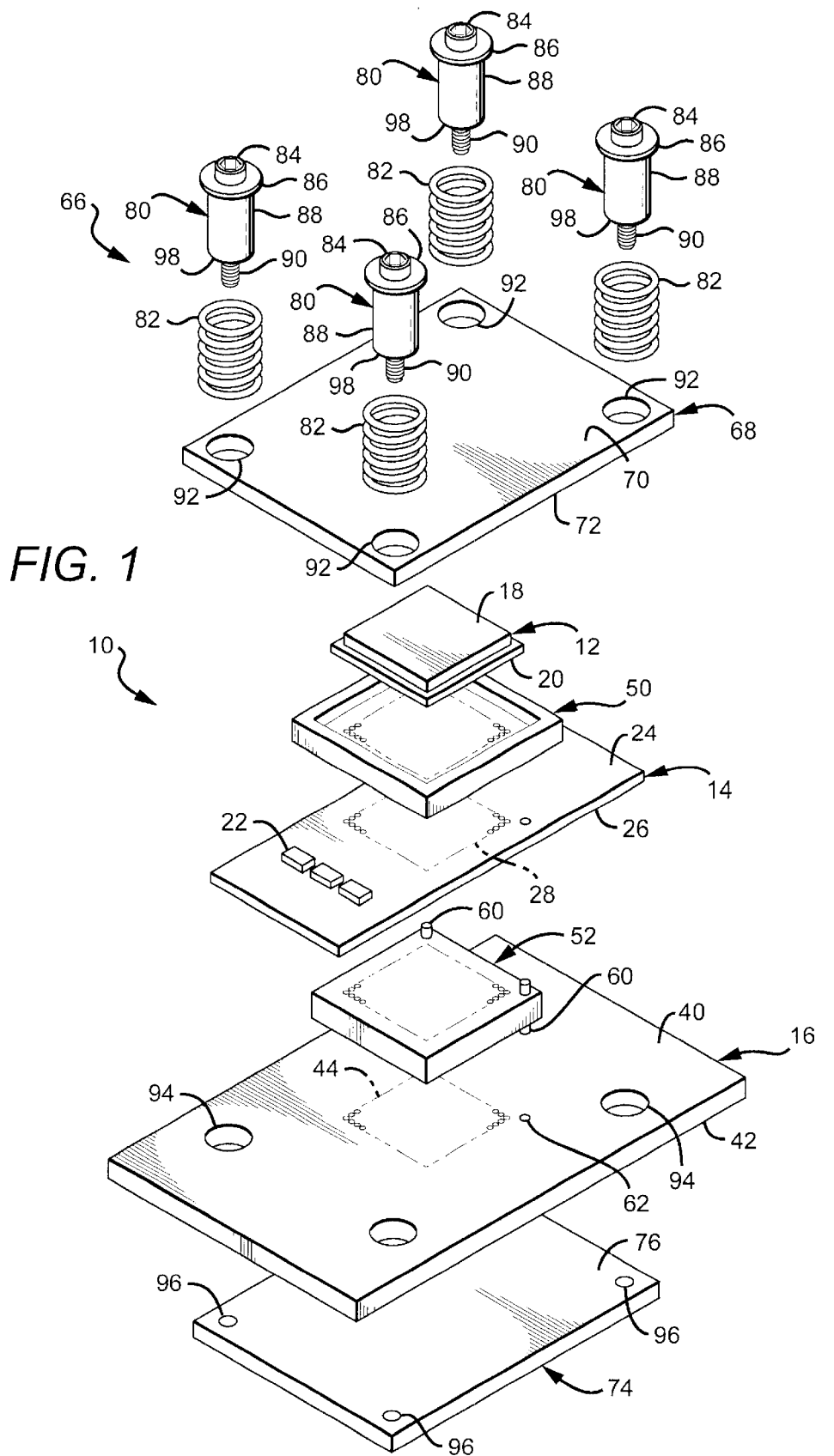
FIG. 1 is an exploded perspective view of an IC device package interconnecting, in stacked relationship, an IC device, a daughter card and a mother board, in accordance with a first embodiment of the present invention.
Figure 2:
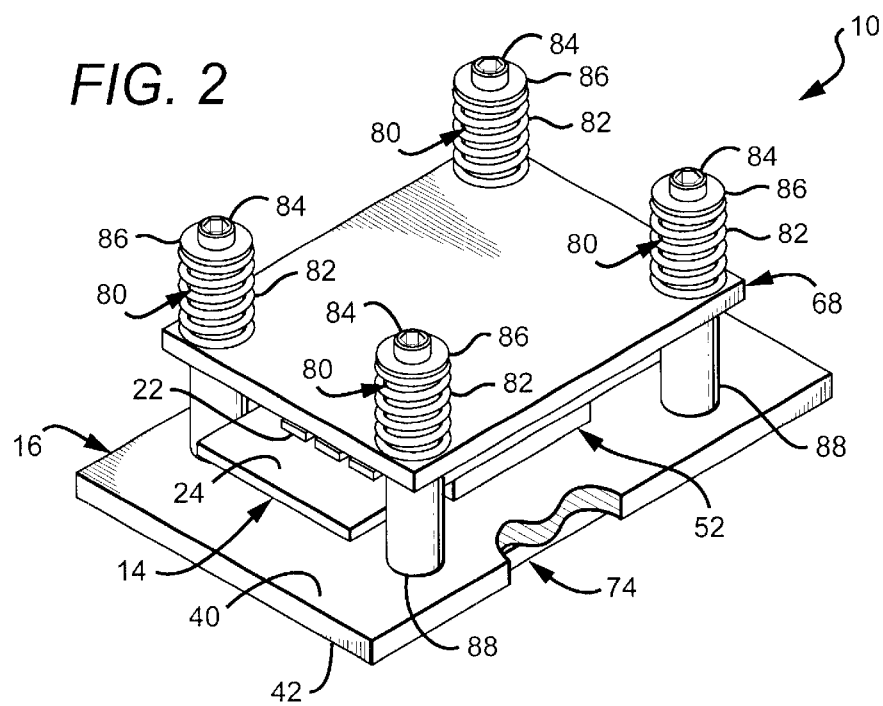
FIG. 2 is a perspective view of the package of FIG. 1 in its assembled state.
Figure 3:
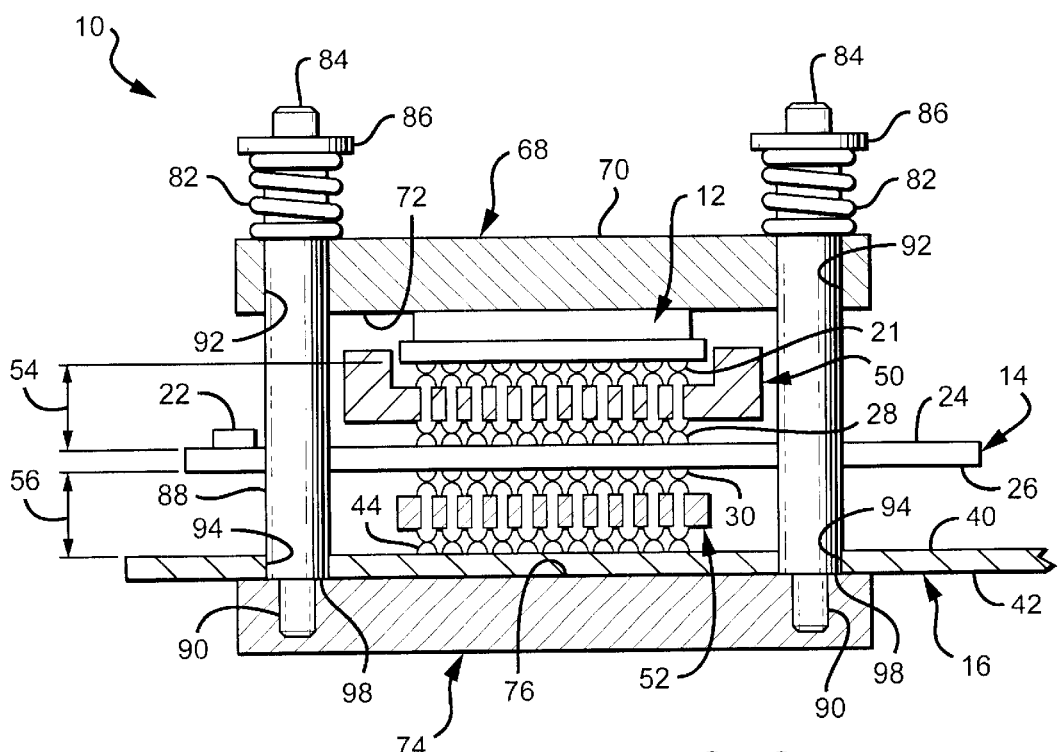
FIG. 3 is a simplified, side elevation view, in cross section, of the package shown in FIG. 2, with the various components enlarged for clarity.

FIGS. 1–3 show a first embodiment comprising a package 10 electrically connecting multiple stacked electrical components including, in top down sequence, a land grid array (LGA) integrated circuit device 12, a first circuit board 14 and a second circuit board 16.

The LGA IC device 12 may comprise, by way of example, a very large scale integration (VSLI) integrated circuit such as a CPU in a ceramic LGA package, a large gate array or an application specific integrated circuit (ASIC). The IC device 12 has a first or upper surface 18 and a second or lower surface 20 opposite the first surface. The second surface 20 is provided with a pad 21 comprising electrical contacts in the form of a land grid array.

The first circuit board 14 will typically comprise a daughter board or card and will hereinafter be referred to as such. The daughter card 14 carries various electrical elements 22 primarily serving to add higher functionality to the IC device 12. Examples of increased functionality could include power delivery, signal termination, power supply bypassing and cache memory. The daughter card 14 includes opposed, parallel, first (top) and second (bottom) major surfaces 24 and 26, respectively, which include pads 28 and 30, respectively, with appropriate metalization-defining contacts in the form of a land grid array electrically connected to elements on the daughter card 14.

The second circuit board 16 will typically comprise a mother board forming part of a computer system. The mother board 16 has opposed, parallel first (top) and second (bottom) major surfaces 40 and 42, respectively, supporting various electrical elements. The first or top surface 40 of the mother board 16 includes a land grid array 44 electrically connected to elements mounted on the mother board.

In accordance with the invention, a first or upper LGA interposer socket 50 is sandwiched between the LGA contact pad 21 on the IC device 12 and the LGA contact pad 28 on the first or top surface 24 of the daughter card 14, and a second or lower LGA interposer socket 52 is sandwiched between the LGA contact pad 30 on the second or bottom surface 26 of the daughter card 14 and the LGA contact pad 44 on the first or top surface 40 of the mother board 16. The IC device 12, the first LGA socket 50 and the LGA pad 28 on the top surface 24 of the daughter card 14 thus form a first interconnect level 54, and the LGA pad 30 on the bottom surface 26 of the daughter card 14, the second LGA socket 52 and the LGA pad 44 on the mother board 16 form a second interconnect level 56.

Alignment pins such as pins 60 and associated apertures such as apertures 62 (not shown on all components) may be provided on the LGA interposer sockets and the daughter and mother board to ensure precise registration of the various components. The need to precisely align the various LGA surfaces, is well understood in the art.

In accordance with the first embodiment, there is provided a clamping or compression mechanism 66 including a clamping plate 68 having an upper surface 70 and a flat lower surface 72 engaging the upper surface 18 of the IC device 12; a backing plate 74 having a flat upper surface 76 engaging the second or bottom major surface 42 of the mother board 16; and means coupling the clamping plate 68 and the backing plate 74 for applying a predetermined compression or clamping load to the stacked components to ensure proper loading of the contact arrays. By way of example and not limitation, the total clamping or compression load may be in the range of 150 to 200 pounds for LGA interposer sockets each having 1,089 contacts.

The clamping plate 68 is used to apply the load to the top of the multi-component stack. For high power IC devices, the clamping plate 68 may be in the form of a heat sink of any of the types disclosed, for example, in the above-mentioned U.S. Pat. Nos. 6,061,235; 6,084,178; 6,198,630; and 6,129,239, for efficiently dissipating heat from the IC device.

Because of the high clamping loads involved, the relative flexibility of the mother board 16, and the limited ability of the LGA sockets 50 and 52 to mate with nonplanar components, inclusion of the backing plate 74 is desirable to provide additional stiffness to the module. The backing plate 74 is preferably fabricated of steel or aluminum, but could be made of other metals or of plastic so long as it provides sufficient stiffness to enable the mother board to maintain a flatness sufficient to accommodate the operating range of the LGA sockets 50 and 52.

In the first embodiment, the predetermined clamping or compression load applying means comprises four identical fasteners 80 each of which compresses a coil spring 82. Each fastener 80 includes a head 84 configured to receive a wrench, a flange 86 under the head 84, a precision machined midsection 88 and a threaded lower end 90. A coil spring 82 is disposed between the flange 86 of each fastener 80 and the upper surface 70 of the clamping plate 68. In the first embodiment, the midsection 88 of each fastener 80 extends through an associated aperture 92 formed in each of the four corners of the clamping plate 68 and through a corresponding precision alignment aperture 94 formed in the mother board 16. The threaded end 90 of each fastener 80 is received by a threaded hole 96 in the backing plate 74. The midsection 88 of each fastener 80 terminates at its lower end in a shoulder 98 which engages the upper surface 76 of the backing plate 74 when the fastener 80 is fully screwed into the backing plate. This fixes the height of the compressed coil spring 82 which, in conjunction with the attributes of the spring, including its length and spring constant, predetermines the compressive or clamping load applied to the stacked assembly. It will be evident to those skilled in the art that each fastener 80 may be fashioned so as to retain the associated coil spring 82 in a partially compressed state to facilitate assembly of the components. Although corner fasteners and coil springs have been found to be best for controlling the applied compressive force and are preferred, other methods for controlling the clamping load will suggest themselves to those skilled in the art. For example, the coil springs could be dispensed with and reliance placed solely on the torque applied by the threaded fasteners. Alternatively, a series of stacked Belleville spring washers could be used instead of a coil spring to control the load applied by each fastener. Still further, a single central fastener carrying a coil spring or a series of stacked spring washers could be used instead of the four corner fasteners.

Figure 4:
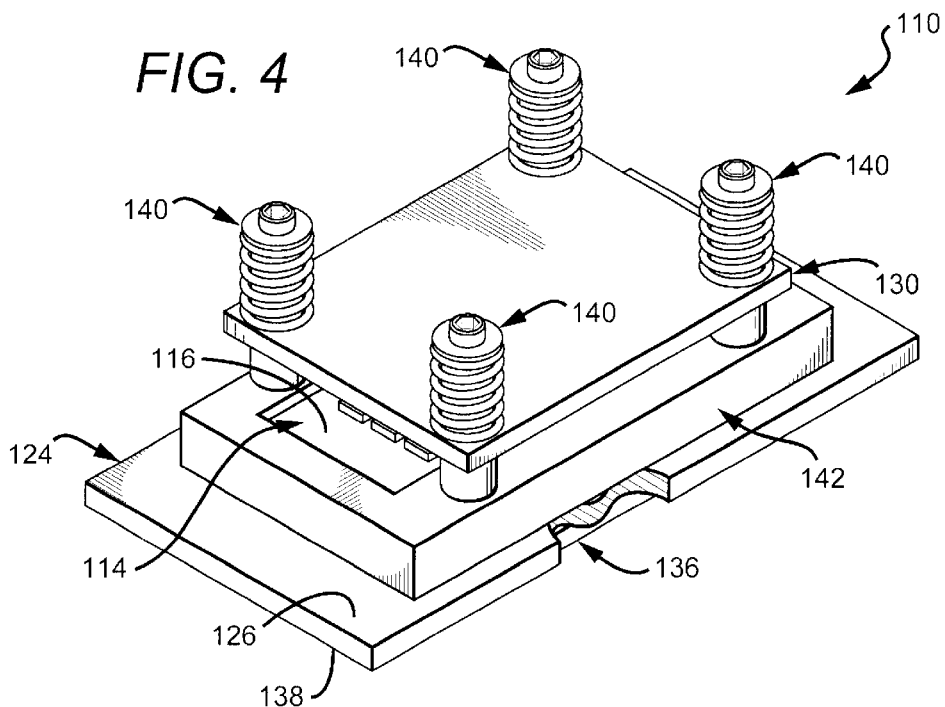
FIG. 4 is a perspective view of an IC device package, in its assembled state, in accordance with a second embodiment of the present invention.
Figure 5:
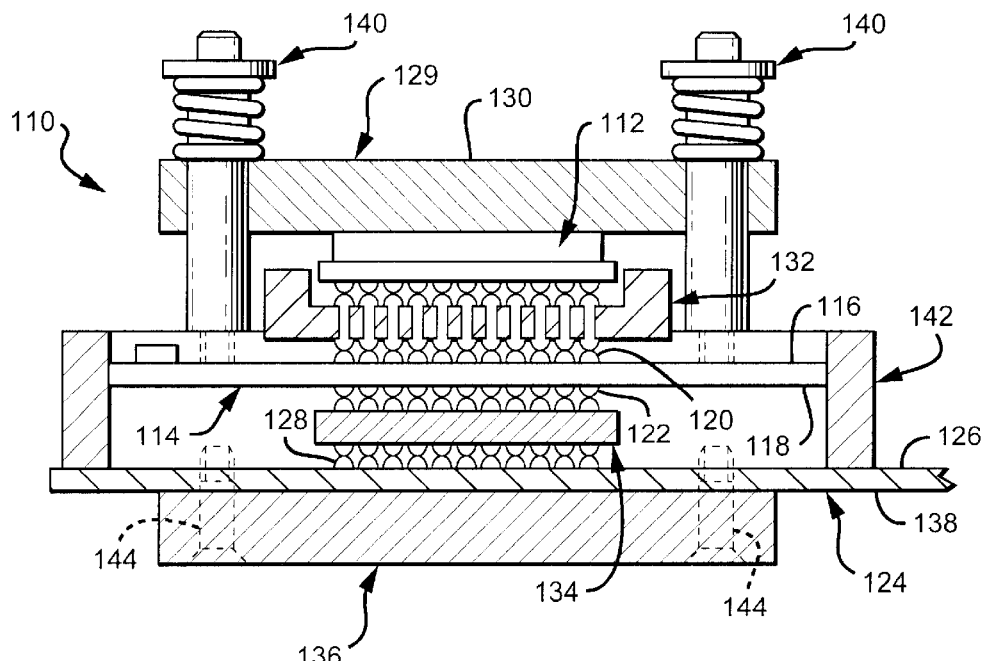
FIG. 5 is a simplified, side elevation view, in cross section, of the package of FIG. 4 with the various components enlarged for clarity.

FIGS. 4 and 5 show an IC device package 110 in accordance with a second embodiment of the invention for interconnecting an LGA IC device 112, a daughter card 114 having a top surface 116 and a bottom surface 118 carrying LGA contact pads 120 and 122, respectively, and a mother board 124 having a top surface 126 carrying an LGA contact pad 128. Like the first embodiment, the second embodiment includes a clamping mechanism 129, a cover or clamping plate 130 overlying the IC device 112, a first LGA interposer socket 132 sandwiched between the LGA on the IC device 112 and top LGA contact pads 120 on the daughter card 114, a second LGA interposer socket 134 sandwiched between the LGA contact pads 122 and 128 on the confronting surfaces of the daughter card 114 and the mother board 124, and a backing plate 136 engaging the bottom surface 138 of the mother board 124. As in the first embodiment, the clamping mechanism 129 includes four spring loaded corner fasteners 140 for subjecting the stacked components to a predetermined clamping or compression load.

The second embodiment differs from the first embodiment in that it includes a retention frame 142 mounted on the top surface 126 of the mother board. By way of example, the retention frame 142 may have a rectangular configuration and may be dimensioned internally so as to snugly receive the daughter card 114 and provide a coarse alignment thereof during placement of the card 114 onto the mother board 124. The retention frame 142 may also function to attenuate or eliminate EMI (electromagnetic interference). As shown in FIGS. 4 and 5, the retention frame can serve as an attachment point for the corner fasteners 140. In this case, the backing plate 136 is secured to the mother board 124 in firm engagement with the bottom surface 138 thereof by means of threaded fasteners 144 passing through the mother board and into the retention frame 142.

Figure 6:
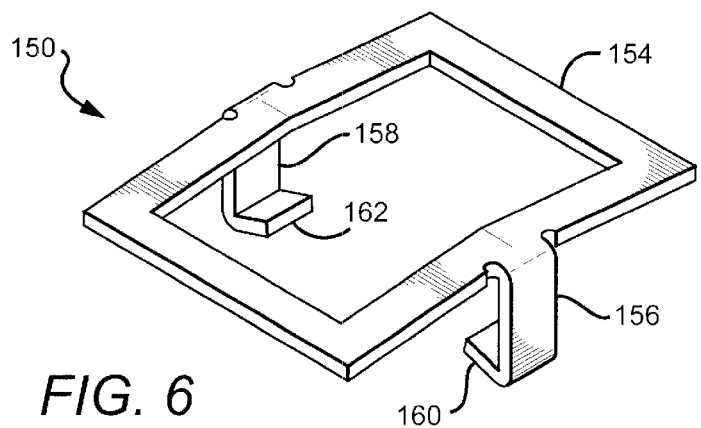
FIG. 6 is a perspective view of a spring clip facilitating the assembly of an IC device package in accordance with the present invention.
Figure 7:
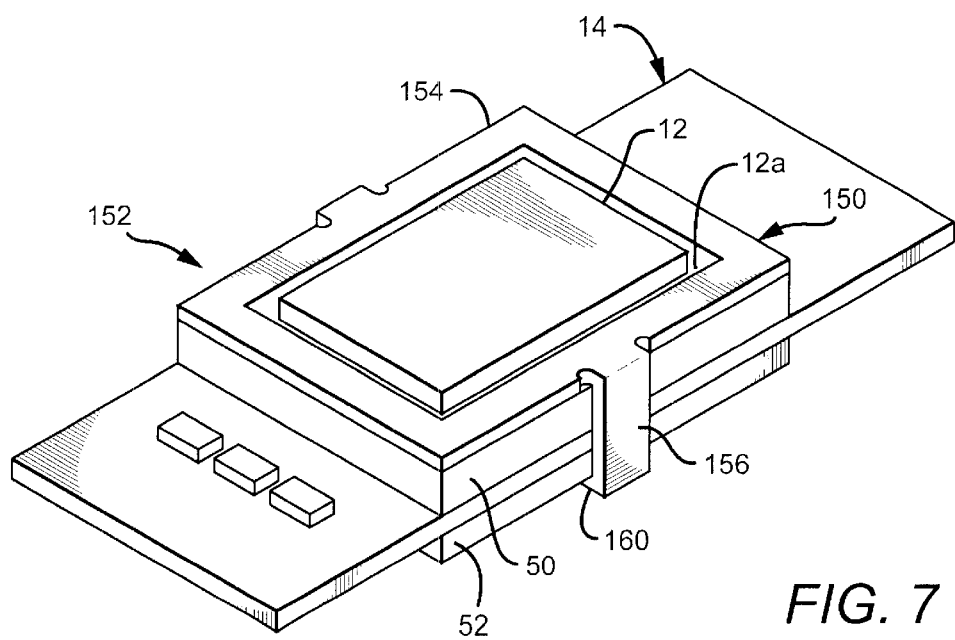
FIG. 7 is a perspective view of a module, comprising a subassembly of an IC device package pursuant to the present invention, held together by the spring clip of FIG. 6.

The assembly of an IC device package such as the package 10 shown in FIGS. 1–3 may be facilitated by means of a spring clip 150 depicted in FIG. 6. As shown in FIG. 7, the spring clip holds together the components of a module 152 forming a subassembly of the package 10 and comprising the IC device 12, the upper LGA interposer socket 50, the daughter card 14 and the lower LGA interposer socket 52. The clip 150 is made of sheet spring material and comprises an upwardly arched, rectangular clip frame 154 including opposed, centrally located, depending side arms 156 and 158 having at their lower extremities inwardly directed fingers 160 and 162, respectively. During assembly, the clip frame 154 is placed about the periphery of the IC device 12 and is pressed down until the fingers 160 and 162 hook the bottom surface of the lower LGA interposer socket 52. The spring clip 150, thus flattened against the base flange 12a of the IC device 12, firmly holds the components of the module 152 together to facilitate the final assembly of the module 152, the cover plate 68, the mother board 16 and the backing plate 74 using the spring loaded corner fasteners 80. The spring clip 150 need not be removed after final assembly of the package 10; it may be left in place on the module 152.

In summary, the present invention interconnects multiple stacked electrical components including an IC device, using pressure actuated LGA contacts and upper and lower LGA interposer sockets. The IC device is connected to a daughter card containing a number of function enhancing components. The entire module comprising the IC device, the daughter card and the LGA interposer sockets, is clamped to a mother board with sufficient force to actuate both the upper and lower LGA interposer sockets. The invention enables increased functionality to be provided an IC device by means of the daughter card onto which a variety of components are placed. By using easily separable LGA interposer sockets manufacturing yields and reliability is substantially improved. Last, by using stacked LGA interposer sockets, a single clamping load can actuate both levels of interconnection. In this regard, as already noted, the first or upper LGA interposer socket provides a first interconnect level between the IC device and the upper surface of the daughter card and the second or lower LGA interposer socket provides a second interconnect level between the lower surface of the daughter card and the top surface of the mother board. Further in this regard, it will be appreciated that one or more additional daughter card/LGA interposer socket levels may be added to the stacked assemblies that have been described and shown.

We claim:

1. An integrated circuit device package comprising:

a land grid array integrated circuit device;

a first circuit board having opposed, parallel, first and second major surfaces, each of the major surfaces of the first circuit board including a land grid array;

a second circuit board having opposed, parallel, first and second major surfaces, the first major surface of said second circuit board including a land grid array;

a first land grid array interposer socket sandwiched between the land grid array integrated circuit device and the land grid array on the first major surface of the first circuit board;

a second land grid array interposer socket sandwiched between the land grid array on the second major surface of the first circuit board and the land grid array on the first major surface of the second circuit board; and a clamping mechanism for compressively urging into electrical interconnection (i) the land grid array integrated circuit device and the land grid array on the first major surface of the first circuit board through the first land grid array interposer socket, and (ii) the land grid array on the second major surface of the first circuit board and the land grid array on the first major surface of the second circuit board through the second land grid array interposer socket.

2. The integrated circuit device package, as defined in claim 1, in which:
said first circuit board comprises a daughter card.

3. The integrated circuit device package, as defined in claim 1, in which:
said second circuit board comprises a mother board.

4. The integrated circuit device package, as defined in claim 1, further comprising:
a clamping plate overlying the land grid array integrated circuit device; and
a backing plate engaging the second major surface of the second circuit board.

5. The integrated circuit device package, as defined in claim 1, wherein the clamping mechanism comprises:
at least one fastener coupling said clamping plate and said backing plate.

6. The integrated circuit device package, as defined in claim 5, in which:
said at least one fastener is spring-loaded.

7. The integrated circuit device package, as defined in claim 5, in which:
said at least one fastener is operable to provide a predetermined level of compression to said IC package.

8. The integrated circuit device package, as defined in claim 1, which includes:
a retention frame secured to the first major surface of the second circuit board, the land grid array on the first major surface of the second circuit board being disposed within the confines of the retention frame; and
a clamping plate overlying the land grid array integrated circuit device.

9. The integrated circuit device package, as defined in claim 1, wherein the clamping mechanism includes:
at least one fastener coupling said clamping is plate and said retention frame.

10. The integrated circuit device package, as defined in claim 8, further comprising:
a backing plate engaging the second major surface of the second circuit board, the backing plate being secured to the retention frame.

11. An apparatus for electrically interconnecting a plurality of stacked electrical components including a land grid array integrated circuit device, a daughter card and a mother board, the daughter card having opposed, parallel, first and second major surfaces, the mother board having opposed, parallel, first and second major surfaces, said apparatus comprising:
a land grid array on each of said first and second major surfaces of the daughter board electrically connected to electrical elements carried by the daughter board;
a land grid array on the first major surface of the mother board electrically connected to electrical elements carried by the mother board;
a first land grid array interposer socket and a second land grid array interposer socket, said first interposer socket enabling electrical connection between said land grid array integrated circuit device and the land grid array on the first major surface of the daughter card, and said second land grid array interposer socket enabling electrical connection between the land grid array on the second major surface of the daughter card and the land grid array on the mother board;
a clamping plate for overlying the integrated circuit device; and
a clamping mechanism for compressively urging the integrated circuit device, said first interposer socket, said daughter card, said second interposer socket and said mother board into electrical interconnection under a predetermined load.

12. The apparatus, as defined in claim 11, further comprising:
a backing plate for engaging the second major surface of the mother board.

13. The apparatus, as defined in claim 12, in which:
said clamping mechanism couples said clamping and said backing plates.

14. The apparatus, as defined in claim 13, wherein the clamping mechanism comprises:
at least one fastener coupling said clamping plate and said backing plate.

15. The apparatus, as defined in claim 11, in which:
said clamping plate is configured as a heat sink.

16. The apparatus, as defined in claim 11, further comprising:
a retention frame for overlying the first major surface of the mother board about the land grid array thereon and for attachment to the backing plate through the mother board.

17. The apparatus, as defined in claim 16, further comprising:
a clamping mechanism for coupling said clamping plate and said retention frame for compressively urging the integrated circuit device, said first interposer socket, said daughter card, said second interposer socket and said mother board into electrical interconnection under a predetermined load.

18. An integrated circuit device package comprising:
a first land grid array (LGA) interposer socket positioned between, and in communication with, an LGA integrated circuit device and a first side of a first circuit board;
a second LGA interposer socket positioned between, and in communication with, a second circuit board and a second side of said first circuit board, wherein said second side of said first circuit board is opposite to and parallel with said first side of said first circuit board; and
a clamping mechanism for compressively urging together said LGA integrated circuit device, said first LGA interposer socket, said first circuit board, said second LGA interposer socket, and said second circuit board into electrical interconnection under a predetermined load.

19. An integrated circuit package, as defined in claim 18, further comprising:
a clip holding together the LGA integrated circuit device, the first LGA interposer socket, the first circuit board and the second LGA interposer socket.

20. An integrated circuit package, as defined in claim 18, further comprising:
a combination of (i) at least one additional circuit board and (ii) an additional LGA interposer socket operatively associated with said at least one additional circuit board, said combination being disposed between, and in communication with, said second LGA interposer socket and said second circuit board.

* * * * *